United States Patent [19] [11] Patent Number: 5,496,770
Park [45] Date of Patent: Mar. 5, 1996

[54] METHOD FOR MANUFACTURING A SEMICONDUCTOR CHIP BUMP HAVING IMPROVED CONTACT CHARACTERISTICS

[75] Inventor: Chun-Geun Park, Suwon, Rep. of Korea

[73] Assignee: Samsung Electronics Co., Ltd., Suwon, Rep. of Korea

[21] Appl. No.: 194,361

[22] Filed: Feb. 8, 1994

[30] Foreign Application Priority Data

Feb. 8, 1993 [KR] Rep. of Korea .......... 93-1663

[51] Int. Cl.⁶ .................................. H01L 21/44
[52] U.S. Cl. ............ 437/183; 437/229; 437/928; 228/180.22; 257/737; 257/738; 216/47
[58] Field of Search ............... 437/183, 229, 437/928; 257/737, 738; 228/180.22; 216/47

[56] References Cited

U.S. PATENT DOCUMENTS

| | | |
|---|---|---|
| 3,821,785 | 6/1974 | Rose . |
| 4,141,731 | 2/1979 | Jarsen ........................ 96/35.1 |
| 4,205,099 | 5/1980 | Jones et al. .................. 437/183 |
| 4,293,637 | 10/1981 | Hatada et al. ................ 430/314 |
| 4,880,708 | 11/1989 | Sharma . |
| 5,185,055 | 2/1993 | Temple et al. ............... 216/47 |
| 5,298,459 | 3/1994 | Arikawa et al. ............. 437/183 |
| 5,310,699 | 5/1994 | Chikawa et al. ............ 437/183 |

FOREIGN PATENT DOCUMENTS

| | | |
|---|---|---|
| 3119550 | 5/1988 | Japan . |
| 0120657 | 1/1989 | Japan . |
| 1293635 | 11/1989 | Japan . |

*Primary Examiner*—Olik Chaudhuri
*Assistant Examiner*—Long Pham
*Attorney, Agent, or Firm*—Cushman Darby & Cushman

[57] ABSTRACT

A connection bump of a semiconductor chip is formed by a photoresist pattern. The photoresist pattern is obtained through an exposure process by which photolithography solution layers of positive and/or negative type are repeatedly exposed and thereafter developed to obtain a photoresist pattern corresponding to the connection bump. Since the upper portion of the manufactured bump is no larger than the lower portion thereof, the bumps do not contact each other even though the upper portion of the bump is stretched due to a pressure induced during a process of bonding internal leads in a TAB package. The connection bump formed according to the present invention has a high aspect ratio, thereby preventing the internal leads from contacting the semiconductor chip surface and advantageously facilitating the removal of the photoresist pattern after the bump formation process to simplify overall manufacturing process.

10 Claims, 3 Drawing Sheets

METHOD FOR MANUFACTURING A SEMICONDUCTOR CHIP BUMP HAVING IMPROVED CONTACT CHARACTERISTICS

BACKGROUND OF THE INVENTION

1. Field of the Invention

The present invention relates to a method for manufacturing a semiconductor chip bump for densely-packed mounting, and more particularly to a method for manufacturing a semiconductor chip bump wherein a photoresist layer is formed by repetition of a photolithography process on a region to obtain the semiconductor chip bump of a desired shape required for bonding internal leads in a tape automated band (TAB) package of a desired shape and improve reliability during bonding the internal leads of a lead frame in the TAB process.

2. Description of the Related Art

In TAB packages, a metal pattern serving as a lead frame and associated wiring is generally provided on an insulating film. The TAB package, in contrast to bonding wire packaging, is one kind of surface mount packaging technique that bonds the metal pattern formed on the insulating film to a bonding pad of a semiconductor chip using a physical "bump" composed of a conductive material. This method is widely used in hand-held calculators, liquid crystal displays (LCDs), computers, etc.

The TAB package has been developed as a slim TAB or small TAB package to obtain miniaturization and thinning of the resulting package.

FIG. 1 is a plan view showing one example of a TAB package using a general tape carrier.

Referring to FIG. 1, a tape carrier 10 applied to the TAB package is formed such that a metal layer attached on a base film 12 consisting of polyimide, polyester, polyester sulfone, polyparalic acid, etc. is subjected to a photolithography process to form internal leads 13 and external leads 14. Internal leads 13 are connected to a semiconductor chip 11.

The center of the base film 12 is punched to form a device aperture 15 to expose ends of the internal leads 13. A slot 16 is formed to expose one side of the external leads 14 for electrical connection to external pins.

A bump (not shown) is formed on the substrate adjacent to the lower end of the internal leads 13 by a thermocompression method for electrical connection to the electrode pin of the semiconductor chip 11. In the TAB package, the internal leads 13, the bump, the upper surface of the semiconductor chip 11, etc. are shielded by a sealing resin (not shown).

Along with achieving high packing density in the semiconductor device, the fine pitch in the TAB package increases the number of leads and reduces the spacing between the leads and, in turn, the required spacing between the bumps on the semiconductor chip.

Such a semiconductor chip bump used in TAB packaging is formed by any conventional method, such as an electroplating process or an oxidation-reduction to deposit a metal, using a photoresist pattern on a pad of the semiconductor chip. The method for manufacturing the semiconductor chip bump will be described in detail below.

FIGS. 2A and 2B are schematic sectional views showing a method for manufacturing a semiconductor chip bump according to a conventional technique.

Referring to FIG. 2A, a metal line 24 such as a printed circuit line, is formed on a semiconductor substrate 21 via a wiring pattern formation process to establish a bonding pad, and a photoresist pattern 22 is formed to a thickness of approximately 20 µm which exposes a barrier metal layer 26 formed on the bonding pad.

The bonding pad is provided by a sequentially-formed insulating layer 23, metal line 24, and passivation layer 25 on the semiconductor substrate 21. A predetermined portion of the metal line 24 in the bonding pad is exposed to form the barrier metal layer 26 on the metal line 24 and the passivation layer 25.

A general photolithography process for forming the photoresist pattern is performed as follows. A photoresist solution composed of a photosensitive material, resin, etc. is dissolved in a solvent and is coated evenly on a semiconductor substrate via a spin-coating. A soft baking is then carried out at a low temperature. Then, light is selectively irradiated through a pattern mask, and a development step is performed to form a photoresist pattern of a predetermined shape. At this time, an exposed or unexposed portion of the pattern mask is selectively removed in the developing process, using a weak alkaline developer solution having tetramethyl-ammonium hydroxide (TMAH) as a main ingredient, thereby forming the photoresist pattern.

Referring to FIG. 2B, the photoresist pattern 22 of a predetermined shape formed on the semiconductor substrate 21 forms a bump 27 having a predetermined height on the portion of the barrier metal layer 26 exposed by the photoresist pattern 22. The photoresist pattern 22 is then removed.

The bump 27 must have sufficient height, (e.g., approximately 20 µm), to prevent contact between the semiconductor substrate 21 and internal leads 13 during the process of bonding the internal leads of the TAB package.

However, in the conventional method for manufacturing the semiconductor chip bump, a bump having a desired height is formed using a photoresist pattern formed via a single photolithography process as a pattern mask. Because a single photolithography process is used, the thickness of the photoresist layer is limited to about 20 µm. This is the distance over which light can travel while still inhibiting an increase in the aspect ratio (a ratio of height to diameter) of the bump beyond a certain degree. Therefore, the aspect ratio cannot be selectively adjusted in the conventional method.

As the height of the conventional semiconductor chip bump increases, the difference between the upper and lower diameters of the photoresist pattern increases in conjunction with the characteristics of the photolithography process (note FIG. 2A). Thus, the lower diameter of the bump becomes smaller than the upper diameter thereof, thereby concentrating force onto the bonding pad when bonding the bump to the internal leads, thereby causing cracks in the bonding pad.

Because high packing density reduces the spacing between the bumps during the process of bonding the internal leads to respective bumps, the upper larger diameter portion of adjacent bumps can contact one another.

Also, the photoresist pattern on the lower portion of the bump is frequently not completely removed by the process of removing the photoresist pattern. An additional process for removing the remaining photoresist pattern must therefore be performed, which makes the manufacturing process more complicated.

Moreover, if the edge of the upper surface in the bump is higher than that of the center portion thereof, contact failure with the internal lead can occur due to inconsistent contact between the leads and the bump. In order to prevent this, a mushroom-shaped bump may be formed, which, however, has a bump higher than the photoresist pattern. Therefore, contact failure with the internal leads can be prevented, but cracks in the bonding pad can occur or the bumps can contact each other.

SUMMARY OF THE INVENTION

Accordingly, it is an object of the present invention to provide a method for manufacturing a semiconductor chip bump capable of preventing cracking in a bonding pad, contact between adjacent bumps, and incomplete removal of the photoresist pattern during a process of bonding internal leads by optionally adjusting the shape and the aspect ratio of the bump.

It is another object of the present invention to provide a method for manufacturing a semiconductor chip bump capable of achieving fine pitch therein and having sufficient height to help maintain an assured electrical connection between the TAB package and the semiconductor chip bonding pads.

Accordingly, a method is provided wherein the chip bump is formed using a photoresist pattern. The photoresist pattern having sufficient thickness is formed by repeatedly performing a photolithography process to convert combinations of positive and negative type photoresist solutions into a photoresist pattern mask.

As a result, the upper portion of the resultant bump has a diameter smaller or the same as that of the lower portion thereof to prevent the bumps from contacting each other even though the upper portion of the bump is stretched by means of the pressure during the process of bonding the internal leads in the TAB package.

Moreover, the photoresist pattern for defining the bump is formed through repeatedly performing a photolithography process to form a bump having a high aspect ratio, thereby preventing the internal leads from contacting the surface of the semiconductor chip. Furthermore, the photoresist pattern is easily removed after forming the bump to simplify the overall manufacturing process.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

First Embodiment

A method for manufacturing a semiconductor chip bump according to a first embodiment is shown in FIGS. 3A to 3D, including forming a photoresist pattern by performing a photolithography process at least twice.

Figure 1:
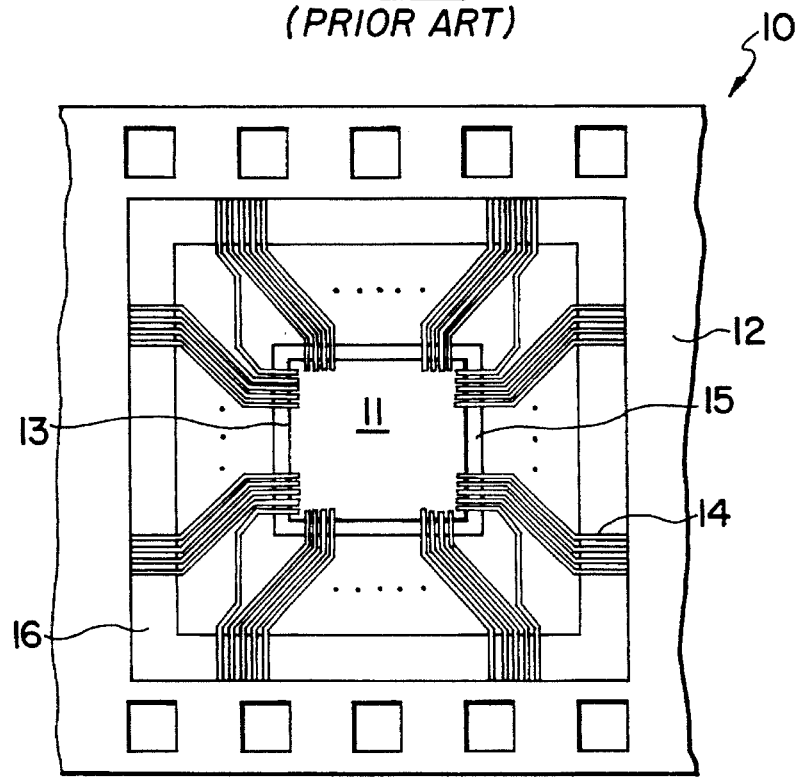
FIG. 1 is a plan view showing one example of a TAB package using a general tape carrier.
Figure 2A:
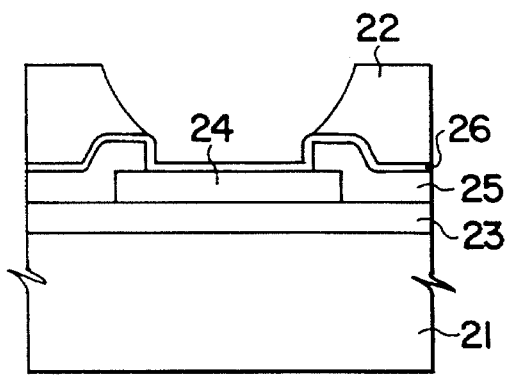
FIGS. 2A and 2B are schematic sectional views showing a method for manufacturing a semiconductor chip bump according to a conventional technique.
Figure 2B:
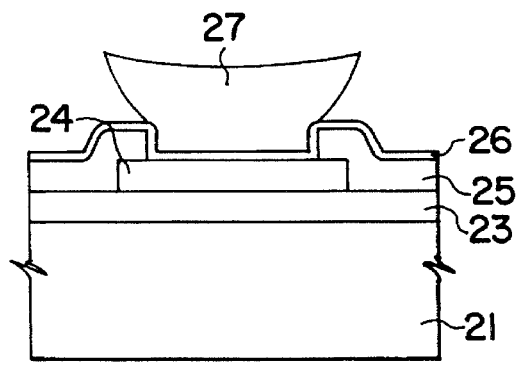
Figure 3A:
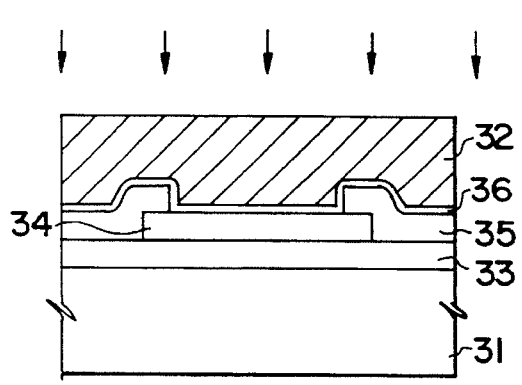
FIGS. 3A to 3D are sectional views showing one embodiment of a method for manufacturing a semiconductor chip bump according to the present invention.

Referring to FIG. 3A, a first positive photoresist solution is coated by a spin coating method on the surface of a bonding pad on a semiconductor substrate 31 to define a region where a semiconductor chip bump is to be formed. The first positive photoresist solution is thereafter exposed by light irradiated over its surface.

The bonding pad is formed by sequentially stacking an insulating layer 33, a metal line 34, and a passivation layer 35 on the semiconductor substrate 31. The bonding pad further includes a barrier metal layer 36 formed on the metal line 34 exposed by the passivation layer 35.

Figure 3B:
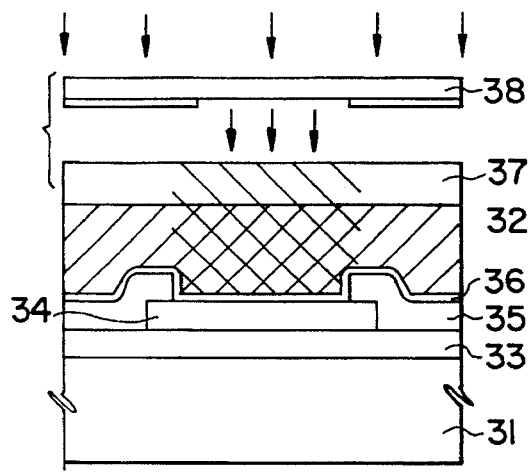

Referring to FIG. 3B, a positive-type second photoresist solution is coated to a predetermined thickness on the first photoresist layer 32 by a spin-coating method to form a second photoresist layer 37. The exposed first photoresist layer 32 and the second photoresist layer 37 on the barrier metal layer 36 are exposed with a predetermined level of energy, using a pattern mask 38.

Figure 3C:
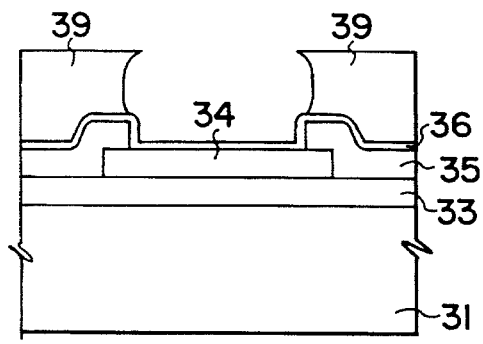

Referring to FIG. 3C, the first and second photoresist layers 32 and 37 are developed through a developing process to form a photoresist pattern 39 for allowing the barrier metal layer 36 to be exposed.

At this time, the total height of the completed photoresist pattern 39 is the same as or slightly higher than the height of a bump to be formed, (e.g., 10 μm or higher). In addition to the height, since the first photoresist layer 32 is exposed twice, it is removed faster than the second photoresist layer 37 (which has been exposed only once) during the developing process, thereby opening the bottom side of the photoresist pattern 39 more than the upper side thereof.

Figure 3D:
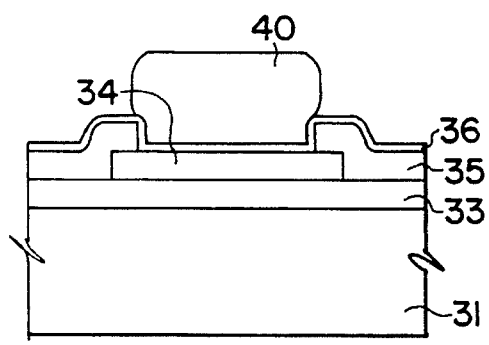

Referring to FIG. 3D, the semiconductor substrate 31 having the above-described structure is subjected to any suitable conventional metal deposition method such as electroplating or chemical reduction reaction to form a bump 40 on the barrier metal layer 36. The photoresist pattern 39 is then removed. Therefore, it can be seen that the bump 40 according to the first embodiment is formed with a pot-shape having a wide bottom portion.

Second Embodiment

FIGS. 4A to 4D are sectional views illustrating a second embodiment of the method for manufacturing a semiconductor chip bump according to the present invention in which the same elements as those shown in FIGS. 3A to 3D are designated by the same reference numerals.

Figure 4A:
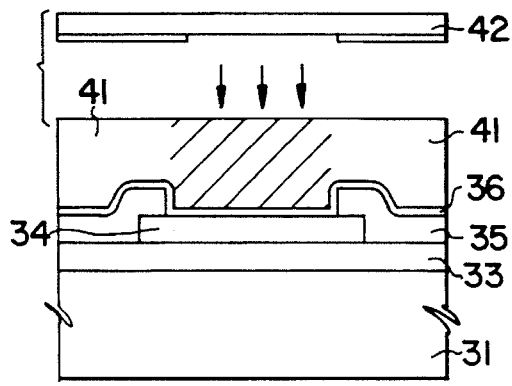
FIGS. 4A to 4D are sectional views showing another embodiment for manufacturing a semiconductor chip bump according to the present invention.

Referring to FIG. 4A, a first positive-type photoresist solution is coated on the surface of a bonding pad of a semiconductor substrate 31 to define a region on which a semiconductor chip bump is to be formed by a spin coating method to form a first photoresist layer 41. The first photoresist layer 41 on the barrier metal layer 36 is exposed to light by irradiating the light with an energy of 100 to 2000 mJ/cm$^2$ using a first pattern mask 42.

Figure 4B:
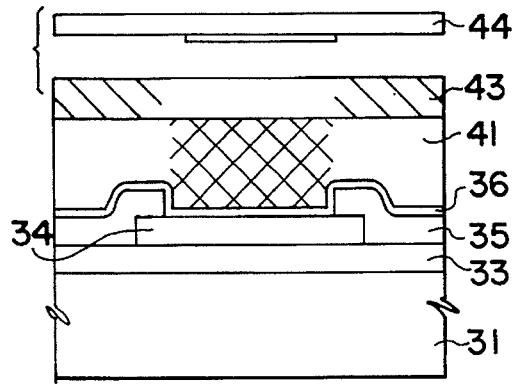

Referring to FIG. 4B, a negative-type second photoresist solution is coated on the first photoresist layer 41 to form a second photoresist layer 43 with a predetermined thickness by a spin-coating method. A second exposure is carried out with a predetermined energy of, e.g., 100 to 2000 mJ/cm² using a second pattern mask 44 which has a pattern opposite or inverse to the first pattern mask 42. At this time, the first exposed portion of the first photoresist layer 41 is shielded by the second photoresist layer. Here, the higher sensitivity of the negative second photoresist layer 43 promotes the effect.

Figure 4C:
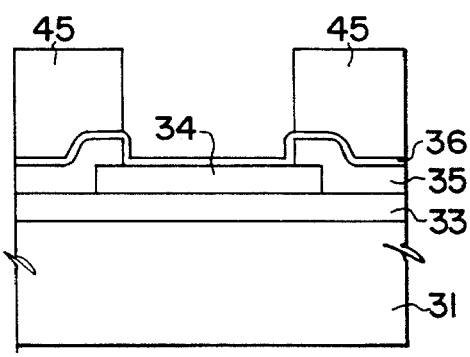

Referring to FIG. 4C, the first and second photoresist layers 41 and 43 formed on the bonding pad of the semiconductor substrate 31 are developed and then removed to form a photoresist pattern 45. At this time, the height of the photoresist pattern 45 is at least about 10 μm.

Figure 4D:
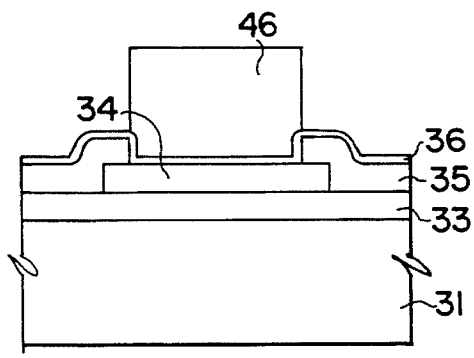

Referring to FIG. 4D, the above-described semiconductor substrate 31 is processed to form a bump 46 on the barrier metal layer 36 via a conventional metal deposition method. The photoresist pattern 45 is thereafter removed. The height of the bump 46 is the same as or smaller than that of the photoresist pattern 45, and the semiconductor chip bump 46 according to the second embodiment is shaped as a post.

Third Embodiment

Figure 5:
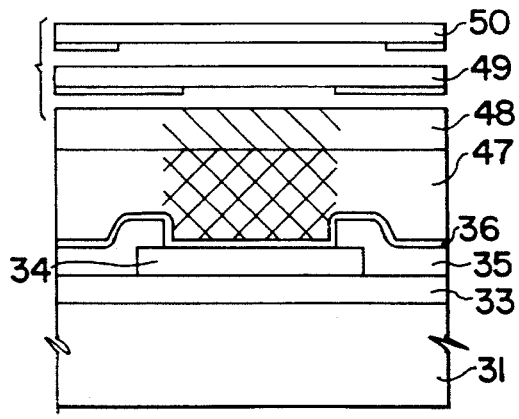
FIG. 5 is a sectional view schematically showing a third embodiment of the method for manufacturing the semiconductor chip bump according to the present invention.

FIG. 5 is a view schematically illustrating a third embodiment of the method for manufacturing the semiconductor chip bump according to the present invention, wherein, since the manufacturing process is similar to the above-described methods, the same parts are omitted to schematically show the third embodiment.

Referring to FIG. 5, the first and second photoresist solution layers 47 and 48 may be both positive type, both negative type, or one of each. Furthermore, a first pattern mask 49 has a pattern aperture which is between about 10% and about 90% smaller with respect to aspect ratio than a second pattern mask 50.

The mask regions corresponding to the bump regions are formed to transmit or shield the light depending on whether the first and second photoresist layers 47 and 48 are formed of the positive or negative type.

Figure 6:
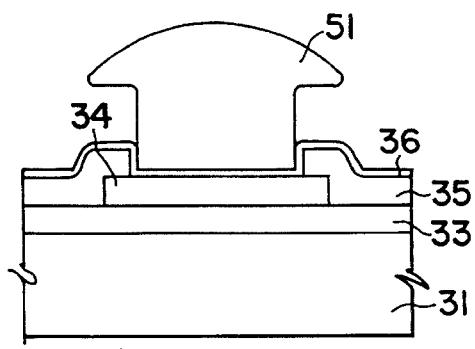
FIG. 6 is a sectional view showing the semiconductor chip bump manufactured according to the method shown in FIG. 5.

FIG. 6 is a sectional view showing the semiconductor chip bump manufactured according to the method described in connection with FIG. 5.

Referring to FIG. 6, a semiconductor chip bump 51 formed on the barrier metal layer 36 of the semiconductor substrate 31 is generally shaped as a mushroom. The bump 51 is formed higher than the photoresist pattern formed by several repetitions of photolithography processes. The bump 51 is higher than conventional bumps, and the upper portion of the bump 51 is bulged to prevent the contact failure when bonding to the internal lead. However, the aspect ratio of the bump 51 is adjusted to prevent adjacent bumps from being contacting one another, in contrast with the conventional mushroom-shaped bump discussed above.

The photolithography process is performed twice but may be performed several times to form the photoresist pattern, and the shape of the bump is selectively adjustable by properly adapting the thicknesses of the photoresist solutions and pattern masks.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method for manufacturing a connection bump on a semiconductor chip bonding pad, comprising the steps of:

(a) depositing a first photoresist layer on said bonding pad;

(b) exposing said first photoresist layer;

(c) depositing a second photoresist layer on said exposed first photoresist layer;

(d) exposing a portion of said second photoresist layer and further exposing a portion of said exposed first photoresist layer through a pattern mask;

(e) developing said exposed first and second photoresist layer portions to obtain a photoresist pattern; and (f) depositing a metal in the photoresist pattern to obtain a connection bump.

2. The method according to claim 1, wherein said step of exposing a portion of said second photoresist layer and further exposing a portion of said first photoresist layer is performed by irradiating light through a pattern mask;

3. The method according to claim 1, wherein said photoresist pattern corresponding to said connection bump has a lower diameter which is at least as large as an upper diameter of the photoresist pattern.

4. The method according to claim 1, wherein a thickness of the photoresist pattern is at least about 10 μm.

5. The method according to claim 1, wherein said step of depositing a metal in the photoresist pattern includes a step of electroplating a metal.

6. The method according to claim 1, wherein said step of depositing a metal in the photoresist pattern includes a step of metal plating by a chemical oxidation-reduction reaction.

7. A method for manufacturing a connection bump on a semiconductor chip bonding pad, comprising the steps of:

(a) sequentially depositing first and second positive-type photoresist layers on said bonding pad;

(b) exposing said first and second positive-type photoresist layers by irradiating light through first and second pattern masks;

(c) forming a photoresist pattern by developing said exposed first and second positive-type photoresist layers; and (d) depositing a metal in the photoresist pattern to obtain a connection bump.

8. The method for manufacturing a connection bump on a semiconductor chip bonding pad as claimed in claim 7, wherein said second pattern mask has an aperture which is larger than said first pattern mask.

9. The method for manufacturing a connection bump on a semiconductor chip bonding pad as claimed in claim 7, wherein said second aperture pattern exposes an area which is larger than said first aperture pattern, 10. The method for manufacturing a connection bump on a semiconductor chip bonding pad as claimed in claim 7, wherein said second aperture pattern exposes an area which is smaller than said first aperture pattern.

* * * * *